United States Patent
Kim et al.

(10) Patent No.: US 7,724,574 B2
(45) Date of Patent: May 25, 2010

(54) SEMICONDUCTOR MEMORY DEVICE AND DATA WRITE AND READ METHOD THEREOF

(75) Inventors: Jin-Kuk Kim, Hwaseong-si (KR); Woo-Seop Jeong, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 333 days.

(21) Appl. No.: 11/769,758

(22) Filed: Jun. 28, 2007

(65) Prior Publication Data

US 2008/0094890 A1    Apr. 24, 2008

(30) Foreign Application Priority Data

Oct. 20, 2006    (KR) ...................... 10-2006-0102534

(51) Int. Cl.
   *G11C 16/04* (2006.01)
(52) U.S. Cl. .............................. 365/185.11; 365/230.03
(58) Field of Classification Search ............ 365/185.11, 365/230.03
   See application file for complete search history.

(56) References Cited

U.S. PATENT DOCUMENTS

2002/0051404 A1 * 5/2002 Ooishi et al. ................ 365/233
2004/0177296 A1 * 9/2004 Saito .......................... 714/724
2005/0152194 A1 * 7/2005 Boldt et al. .................. 365/201

FOREIGN PATENT DOCUMENTS

| JP | 09-044412 | 2/1997 |
|---|---|---|
| JP | 2006-059492 | 3/2006 |
| JP | 2006-085770 | 3/2006 |
| JP | 2006-134374 | 5/2006 |
| KR | 1020010063539 A | 7/2001 |

* cited by examiner

*Primary Examiner*—Hoai V Ho
*Assistant Examiner*—Jason Lappas
(74) *Attorney, Agent, or Firm*—Volentine & Whitt, PLLC

(57) ABSTRACT

A semiconductor memory device includes a memory cell array including a plurality of memory banks, an address input portion which receives a row address and a column address through address pins during a normal mode operation and which receives the row address, the column address and write data through the address pins during a test mode operation, an address decoder which accesses one of the plurality of memory banks during the normal mode operation and at least two of the plurality of memory banks during the test mode operation in response to the row address and the column address, a data input portion which inputs write data applied through data pins to the memory cell array during the normal mode operation and which inputs write data output from the address input portion to the memory cell array during the test mode operation, and a data output portion which outputs read data output from the memory cell array to the data pins during the normal mode operation and the test mode operation.

17 Claims, 7 Drawing Sheets

SEMICONDUCTOR MEMORY DEVICE AND DATA WRITE AND READ METHOD THEREOF

CROSS-REFERENCE TO RELATED APPLICATION

A claim of priority is made to Korean Patent Application No. 10-2006-102534, filed Oct. 20, 2006, the disclosure of which is hereby incorporated herein by reference in its entirety.

BACKGROUND OF THE INVENTION

1. Field of the Invention

The present disclosure relates to a semiconductor memory device and, more particularly, to a method of reading and writing data from/to the semiconductor memory device.

2. Description of the Related Art

Semiconductor memory devices are routinely tested for defects that may have occurred during the manufacturing process. During a typical memory test, a test engineer applies a command including an address and a data type to the memory device. Upon application of this command, an output is received from the memory device. If the output is in accordance with the input provided to the memory device, the memory device is considered to have passed the test.

With recent advances in semiconductor fabrication technology, semiconductor memory devices are becoming increasingly integrated in size, i.e., their size is being continually reduced. As part of this reduction in size, the line width of the semiconductor chip is being continually reduced. The line width of a chip is the distance between the edge of the wafer and the active are (i.e., memory cells) on the wafer. With a decrease in the line width of the semiconductor chip, the probability of manufacturing defects occurring on the chip increases. The increase in the probability of defects occurring in the chip has lead to increasing tests being performed to ensure the quality of the chip. As a consequence, testing times, and hence manufacturing costs, of semiconductor chips have increased.

Generally, I/O pins are used to write data to a memory device and also read data from the memory device. Because the same set of pins are used for reading and writing data from/to the memory device, a typical semiconductor memory device can not simultaneously perform the data read operation and the data write operation.

While a semiconductor memory device may have data input pads and data output pads, these data pads are configured to be commonly used for data input/output. Therefore, no simultaneous transmission and reception of data from the semiconductor memory device may occur via the data input pads and data output pads.

Because of the lack of simultaneous transmission and reception of data from memory devices, the test times for testing memory devices are generally high. This is because a tester has to first input all the test data and then, after inputting all the test data, receive data output from the memory device to determine whether the memory device has passed the test.

Various test modes have been developed in order to reduce the test time. For example, a conventional test method uses a parallel bit test (PBT) to simultaneously test a plurality of semiconductor memory devices. The PBT method does not receive and output data through all data I/O pads of the semiconductor memory device but does receive and output data through a predetermined number of representative data I/O pads, whereby a large number of semiconductor memory devices can be tested simultaneously.

However, even though a number of devices may be tested simultaneously, each test is still performed by first inputting test data and then, after all test data is input, receiving an output to determine whether the device under test as passed the test. That is, there is no method for simultaneously performing the data write operation and the data read operation.

FIG. 1 is a block diagram illustrating a conventional semiconductor memory device. The semiconductor memory device of FIG. 1 comprises a memory cell array 30, an address input buffer 10, a command decoder 12, a mode setting circuit 14, a clock buffer 16, a row address decoder 20, a column address decoder 22, a data write circuit 24, and a data read circuit 28. The memory cell array 30 comprises four memory banks BA_A, BA_B, BA_C, and BA_D. The functions of the components of FIG. 1 are described below.

The clock buffer 16 receives and buffers an external clock signal CLK to generate a buffered clock signal PCLK. The address input buffer 10 receives and buffers an external address ADD to generate an internal row address ra[14:0] in response to an active signal ACT and the buffered clock signal PCLK during an active operation. Furthermore, the address input buffer 10 also receives and buffers the external address ADD to generate an internal column address ca[14:0] in response to a write or read signal WE or RE respectively, and the buffered clock signal PCLK during the write or read operation.

The command decoder 12 receives a command signal CMD and decodes it in response to the buffered clock signal PCLK to generate the active signal ACT, the write signal WE and the read signal RE. The mode setting circuit 14 receives the command signal CMD and the external address ADD and decodes them in response to the buffered clock signal PCLK to generate a test mode setting signal TMRS.

The row address decoder 20 receives the internal row address ra[14:0] and the active signal ACT and decodes them under control of the test mode setting signal TMRS to activate one of a plurality of word selecting signals WL_A, WL_B, WL_C, and WL_D per each of the four memory banks BA_A, BA_B, BA_C, and BA_D. Similarly, the column address decoder 22 receives the buffered internal column address ca[14:0] and the active signal ACT and decodes them under control of the test mode setting signal TMRS to activate one of a plurality of column selecting signals CSL_A, CSL_B, CSL_C, and CSL_D per each of the four memory banks BA_A, BA_B, BA_C, and BA_D.

The data read circuit 28 receives parallel read data outputted from the memory cell array 30 to generate a predetermined number of serial output data Do under control of the test mode setting signal TMRS. Similarly, the data write circuit 24 receives write data Di which are serially input into the data write circuit 24 and converts them into parallel data under control of the test mode setting signal TMRS to generate input data to be input into the four memory banks BA_A, BA_B, BA_C, and BA_D.

The memory cell array 30 comprises the four memory banks BA_A, BA_B, BA_C, and BA_D, and receives write data from the data write circuit 24 in response to the data write signal WE and inputs the write data to each memory bank. In addition, the memory cell array 30 receives read data from each memory bank in response to the data read signal RE and outputs them to the data read circuit 28.

A row address RA and a column address CA are applied to the semiconductor memory device through address pins, and input and output data Di and Do applied to the memory cell array 30 are read from or written to the semiconductor memory device through common data request (DQ) pins or pads.

FIG. 2 is a timing diagram illustrating the data write and read operations of the conventional semiconductor memory device of FIG. 1. The external clock signal CLK, the command signal CMD, the input address signal ADD, the data I/O signal DQ, the test mode setting signal TMRS, the buffered clock signal PCLK, a plurality of memory bank word line selecting signals WL_A, WL_B, WL_C, and WL_D, and a plurality of memory bank column line selecting signals CSL_A, CSL_B, CSL_C, and CSL_D are shown in FIG. 2.

The external clock signal CLK is toggled with a predetermined phase and cycle. Furthermore, the buffered clock signal PCLK is toggled with the same cycle as the external clock signal CLK by buffering the external clock signal CLK.

The command signal CMD loads the active signal ACT, the data write commands WE of each memory bank, and the data read commands RE of each memory bank in order. In addition, the input address signal ADD loads the row address RA through the address pin according to the active command ACT, the column address CA for writing data according to the data write command WE, and the column address CA for reading data according to the data read command RE. Furthermore, in the data I/O signal DQ, write data Di_A-1 to Di_A-M of each of a plurality of memory banks are applied through data pins according to the data write signal WE and read data Do_A-1 to Do_A-M of each of a plurality of memory banks are outputted according to the data read signal RE.

FIG. 3 is an operation timing diagram illustrating data write and read operation time of a plurality of memory banks in the conventional semiconductor memory device of FIG. 1. In particular, the external clock signal CLK, the command signal CMD, and the data I/O signal DQ are shown in FIG. 3.

The buffered clock signal PCLK is toggled with a predetermined cycle, and data write commands WE_A, WE_B, WE_C, and WE_D and data read commands RE_A, RE_B, RE_C, and RE_D of the first to fourth memory banks are alternately loaded as the command signal CMD. In the data I/O signal DQ, a plurality of input data Di_A, Di_B, Di_C, and Di_D and a plurality of output data Do_A, Do_B, Do_C, and Do_D of the first to fourth memory banks are alternately loaded according to the data write commands WE_A, WE_B, WE_C, and WE_D and the data read commands RE_A, RE_B, RE_C, and RE_D of the first to fourth memory banks.

If a time spent to write/read data to/from one memory bank is defined as "T", a time 8T is spent to perform both the data write and read operations in the first to fourth memory banks BA_A, BA_B, BA_C, and BA_D. In particular, the data write and read operations of the conventional semiconductor memory device during a testing operation are described below with reference to FIGS. 1 to 3.

The operation is described below based on the assumption that a plurality of word line selecting signals are n-bit signals, a plurality of column selecting signals are m-bit signals, and test write data Di and test read data Do are M serial data which are converted to (from) N-bit parallel data. First, an operation for sequentially writing data to the first to fourth memory banks BA_A, BA_B, BA_C, and BA_D in the memory cell array 30 from an external device to the semiconductor memory device is described below.

When the row address RA[14:0] of 15 bits is applied together with the active command ACT from the external portion, the command decoder 12 internally generates the active command ACT, and the address input buffer 10 buffers the row address RA to generate the buffered internal row address ra[14:0] of 15 bits in response to the buffered clock signal PCLK. At this time, the row address decoder 20 decodes 13 bits ra[12:0] of the internal row address ra[14:0] to generate word line selecting signals WL1 to WLn, so that one of the word line selecting signals WL1 to WLn is activated. At this time, the row address decoder 20 decodes 2 most significant bits ra[14:13] as the bank address to select the memory bank in the memory cell array 30. The 2 most significant bits may be "00", "01", "10" and "11" which represent the first to fourth memory banks BA_A, BA_B, BA_C, and BA_D.

Thereafter, when the column address CA[14:0] of 15 bits are applied together with the write command from the external portion, the command decoder 12 generates the write command WE, and the address input buffer 10 buffers the column address CA to generate the buffered column address ca[14:0] of 15 bits in response to the buffered clock signal PCLK. The column address decoder 22 decodes 13 bits ca[12:0] of the buffered internal column address ca[14:0] to generate a plurality of column selecting signals CSL1 to CSLm, so that one of the column selecting signals CSL1 to CSLm is activated. Like the row address decoder 20, the column address decoder 22 decodes 2 most significant bits ca[14:13] as the bank address to select the memory bank in the memory cell array 30.

The data write circuit 24 receives M write data Di_A-1 to Di_A-M which are serially inputted, converts them into N-bit parallel data under control of the test mode setting signal TMRS and writes them to memory cells of the selected memory bank of the memory cell array 30.

An operation for sequentially reading data from the first to fourth memory banks in the memory cell array 30 to the external portion is described below.

When the row address RA of 15 bits is applied from the external portion, the same operation as the active command ACT is applied in the above described data write operation is performed, so that one of the word line selecting signals WL1 to WLn and 2 most significant bits ca[14:13] are decoded as the bank address to select the memory bank of the memory cell array 30.

When the column address CA of 15 bits are applied together with the read command RE from the external portion, the command decoder 12 generates the read command RE, and the address input buffer 10 buffers the column address CA to generate the buffered internal column address ca[14:0] of 15 bits in response to the buffered clock signal PCLK.

The column address decoder 22 decodes 13 bits ca[12:0] of the buffered internal column address ca[14:0] to generate the column selecting signals CSL1 to CSLm, so that one of the column selecting signals CSL1 to CSLm is activated. Like the row address decoder 20, the column address decoder 22 decodes 2 most significant bits ca[14:13] as the bank address to select the memory bank in the memory cell array 30.

The data read circuit 28 receives M-bit parallel data outputted from the selected memory bank in the memory cell array 30, converts them into M serial data Di_A-1 to Di_A-M under control of the test mode setting signal TMRS and outputs them.

As described above, the conventional semiconductor memory device cannot perform the data write and read operations simultaneously because data applied through the data I/O pins from an external device are sequentially inputted to each of a plurality of memory banks and data is output sequentially to an external device through the same data I/O pins.

In a semiconductor chip testing scenario, the time taken to first input test data and then to receive outputted test results only after all the test data is input may increase the overall testing time. This problem may be exacerbated as the integration density of semiconductor memory devices increases. This is because as the integration density of semiconductor memory devices increases, the probability of manufacturing defects occurring on the devices also increases thus leading to increased testing times and hence, increased manufacturing costs.

Therefore, there is a need for a method for the simultaneous input of test data and output of the test results so as to reduce the test time for the semiconductor memory device. This reduction in the test time of the semiconductor memory device may lead to lower manufacturing costs, high system operation efficiency and a high speed system operation.

SUMMARY

One aspect of the present disclosure includes a semiconductor memory device. The device includes a memory cell array including a plurality of memory banks, an address input portion which receives a row address and a column address through address pins during a normal mode operation and which receives the row address, the column address and write data through the address pins during a test mode operation, an address decoder which accesses one of the plurality of memory banks during the normal mode operation and at least two of the plurality of memory banks during the test mode operation in response to the row address and the column address, a data input portion which inputs write data applied through data pins to the memory cell array during the normal mode operation and which inputs write data output from the address input portion to the memory cell array during the test mode operation, and a data output portion which outputs read data output from the memory cell array to the data pins during the normal mode operation and the test mode operation.

Another aspect of the present disclosure includes a data write and read method of a semiconductor memory device comprising a memory cell array including a plurality of memory banks and an address decoder which accesses at least one of the plurality of memory banks in response to a row address and a column address. The method comprises inputting an address by receiving the row address and the column address through address pins during a normal mode operation and receiving the row address, the column address and write data through the address pins during a test mode operation, accessing a memory bank by accessing one of the plurality of memory banks during the normal mode operation and at least two of the plurality of memory banks during the test mode operation, in response to the row address and the column address, and inputting/outputting data by inputting write data applied through data pins to the memory cell array and outputting read data outputted from the memory cell array to the data pins during the normal mode operation, and inputting write data to the memory cell array and outputting read data output from the memory cell array to the data pins during the test mode operation.

BRIEF DESCRIPTION OF THE DRAWINGS

The above and other features of the present disclosure will become more apparent to those of ordinary skill in the art by describing in detail exemplary embodiments thereof with reference to the attached drawings in which.

DETAILED DESCRIPTION

Figure 1:
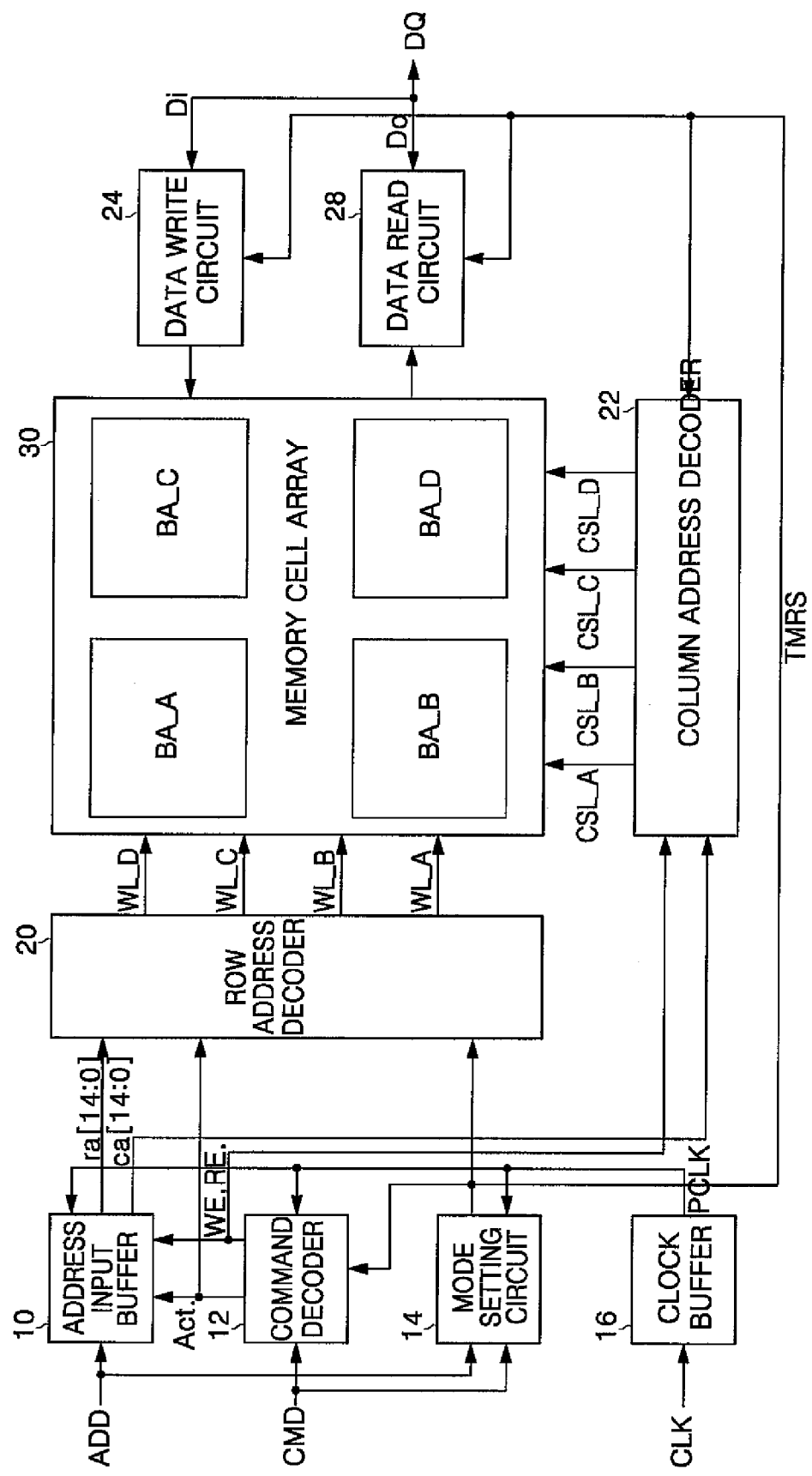
FIG. 1 is a block diagram illustrating a conventional semiconductor memory device.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 4:
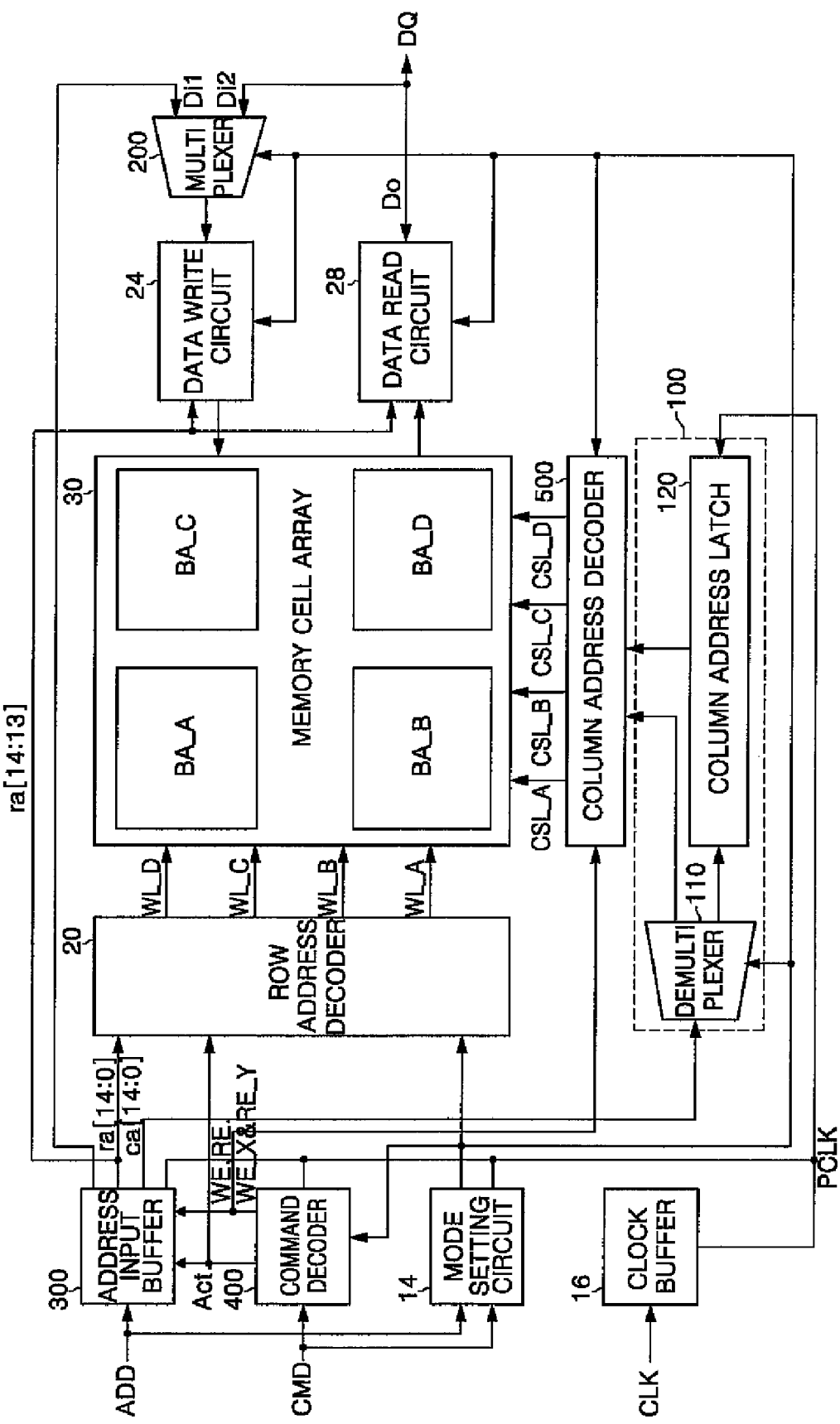
FIG. 4 is a block diagram illustrating a semiconductor memory device according to an exemplary disclosed embodiment.

FIG. 4 is a block diagram illustrating a semiconductor memory device according to an exemplary disclosed embodiment. The semiconductor memory device of FIG. 4 comprises a memory cell array 30, an address input buffer 300, a command decoder 400, a mode setting circuit 14, a clock buffer 16, a row address decoder 20, a column address latch portion 100, a column address decoder 500, a write data selecting portion 200, a data write circuit 24, and a data read circuit 28.

The memory cell array 30 comprises four memory banks BA_A, BA_B, BA_C, and BA_D. The column address latch portion 100 comprises a demultiplexer 110 and a column address latch 120. The write data selecting portion 200 comprises a multiplexer.

Functions of the components of FIG. 4 are described below. In FIG. 4, like reference numerals denote like parts and perform like operations, and thus descriptions of those are omitted. In an exemplary embodiment, the column address latch portion 110, the write data selecting portion 200 and the blocks 24, 28, 300, 400, and 500 connected to the column address latch portion 110 and the write data selecting portion 200 are described below.

The address input buffer 300 receives and buffers the external address ADD to generate an internal row address ra[14:0] in response to the active signal ACT and the buffered clock signal PCLK during the active operation. During the write or read operation, the address input buffer 300 receives and buffers the external address ADD to generate the internal column address ca[14:0] in response to the write or read signal WE or RE and the buffered clock signal PCLK. Furthermore, the address input buffer 300 receives and buffers first write data to generate buffered first write data Di1.

The data write circuit 24 receives first or second write data Di1 or Di2 which are serially inputted through data pins or address pins and converts them into parallel data, and outputs the parallel data to a selected data write memory bank among the four memory banks BA_A, BA_B, BA_C, and BA_D in the memory cell array in response to a combination of the bank address ra[14:13] which are most significant bits of the internal row address ra[14:0].

The data read circuit 28 receives parallel data from a selected data read from a memory bank among the fourth memory banks BA_A, BA_B, BA_C, and BA_D in the memory cell array in response to a combination of the bank address ra[14:13] which are most significant bits of the internal row address ra[14:0], converts the received data to serial data, and outputs them to data pins.

The command decoder 400 performs a decoding operation in response to the command signal CMD and the test mode setting signal TMRS to generate the active signal ACT, the write signal WE, the read signal RE, and a data write and read signal WE_X & RE_Y respectively, of a plurality of memory banks In an exemplary embodiment, X and Y denote names of the four memory banks BA_A, BA_B, BA_C, and BA_D. Furthermore, the active signal ACT, the write signal WE and the read signal RE are output during the normal operation mode in which the test mode setting signal TMRS has a low level, and the active signal ACT and the data write and read signal WE_X & RE_Y of a plurality of memory banks are output during the test operation mode in which the test mode setting signal TMRS has a high level.

The column address latch portion 100 operates such that the demultiplexer 110 receives the internal column address ca[14:0] from the address input buffer 300 and the test mode setting signal TMRS from the mode setting circuit 14, and outputs the internal column address ca[14:0] to the column address decoder 500 during the normal operation mode or to the column address latch 120 during the test operation mode according to the value of the test mode setting signal TMRS. The column address latch 120 receives the internal column address ca[14:0] from the demultiplexer 110 and temporarily latches it, synchronizes it with the buffered clock signal PCLK and then outputs it to the column address decoder 500 during the test operation mode.

The write data selecting portion 200, i.e., the multiplexer receives the first write data Di1 applied through the address pin and the address input buffer 300 and the second write data Di2 applied through the data pin, and the test mode setting signal TMRS. Furthermore, the write data selecting portion 200 outputs the second write data Di2 during the normal operation mode and outputs the first write data Di1 during the test operation mode.

Figure 5:
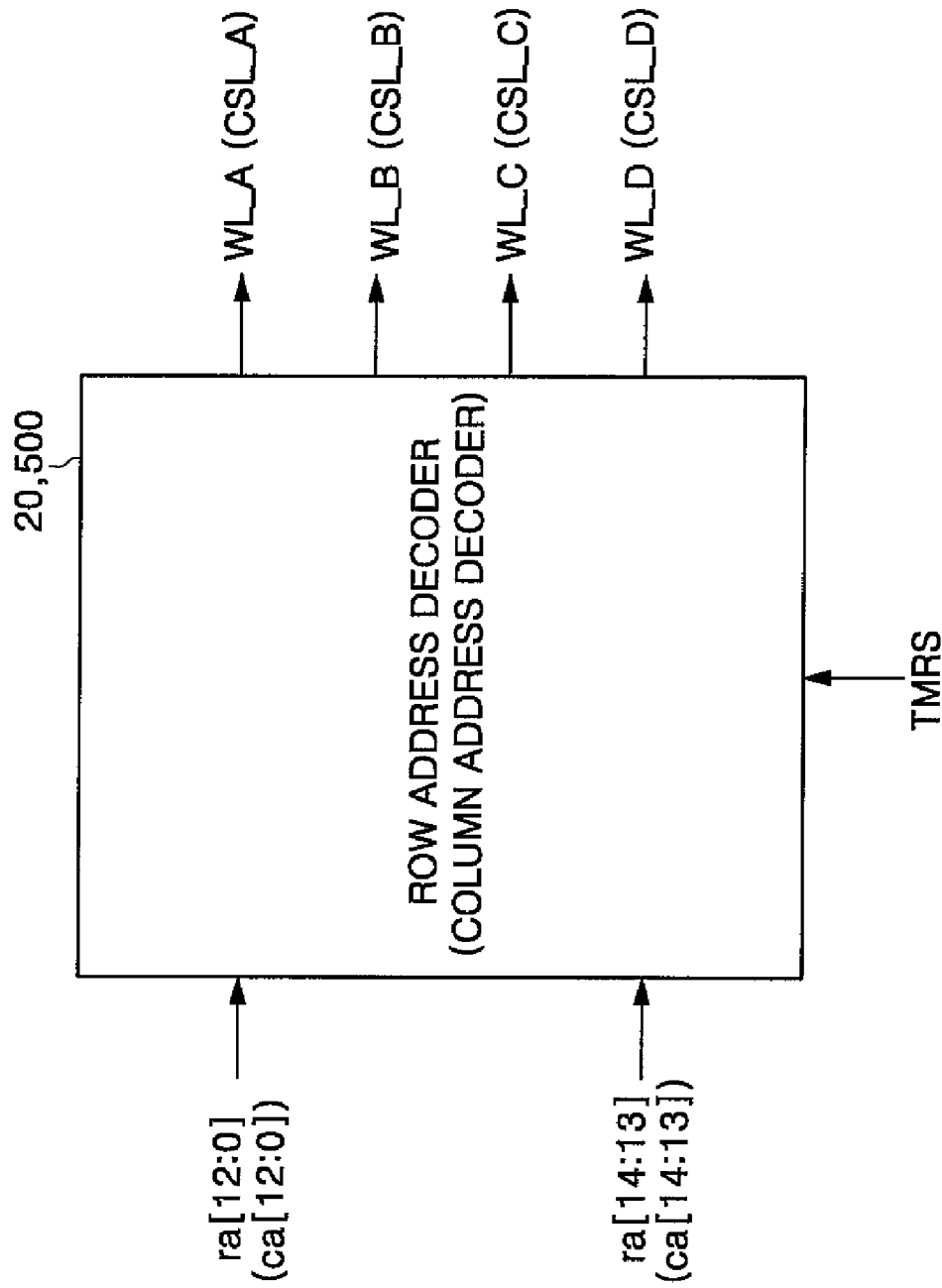
FIG. 5 is a block diagram illustrating an operation of a row address decoder and a column address decoder in the semiconductor memory device of FIG. 4.

FIG. 5 is a block diagram illustrating an operation of the row address decoder and the column address decoder in the semiconductor memory device of FIG. 4. In an exemplary embodiment, the internal row address ra[14:0] or the internal column address ca[14:0] is applied as input signals of the address decoder (row address decoder 20 or column address decoder 500). Furthermore, the test mode setting signal TMRS is applied as a control signal to the row/column address decoder. In addition, an activated signal WL_A, WL_B, WL_C, and WL_D among the word line signals of each of the four memory banks BA_A, BA_B, BA_C, and BA_D or an activated signal CSL_A, CSL_B, CSL_C, and CSL_D among the column selecting signals of each of the four memory banks BA_A, BA_B, BA_C, and BA_D are outputted as output signals.

The bank address is represented by a combination of 2 most significant bits among the internal row address ra[14:0] or the internal column address ca[14:0] and is an address which designates the four memory banks BA_A, BA_B, BA_C, and BA_D under control of the test mode setting signal TMRS.

That is, a combination of the 2 most significant bits is "00", "01, "10", and "11", and "00", "01, "10", and "11" respectively designate the A memory bank, the B memory bank, the C memory bank, and the D memory bank during the data write and read operations. Furthermore, if the memory banks are in normal operation mode, the test mode setting signal TMRS has a low level. On the other hand, if the memory banks are in the test operation mode, the test mode setting signal TMRS has a high level. For example, when a combination of the 2 most significant bits is "00", "01, "10", and "11", "00", "01, "10", and "11" respectively designate the first memory bank BA_A, the second memory bank BA_B, the third memory bank BA_C, and the fourth memory bank BA_D for data write and respectively designate the fourth memory bank BA_D, the first memory bank BA_A, the second memory bank BA_B, and the third memory bank BA_C for data read.

Figure 6:
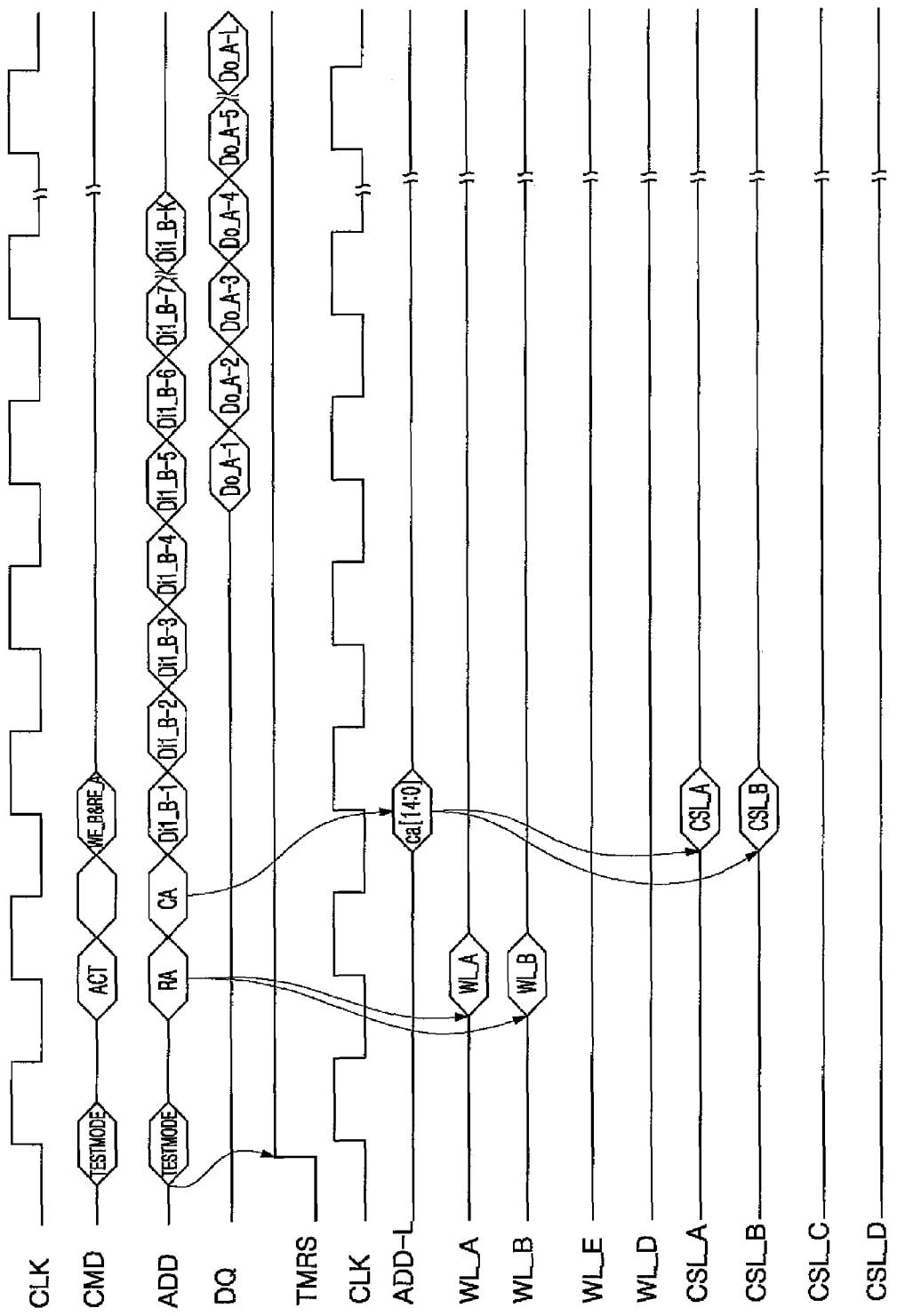
FIG. 6 is a timing diagram illustrating data write and read operations of the semiconductor memory device of FIG. 4.

FIG. 6 is a timing diagram illustrating the data write and read operations of the semiconductor memory device of FIG. 4. The external clock signal CLK, the command signal CMD, the input address signal ADD, the data I/O signal DQ, the test mode setting signal TMRS, the buffered clock signal PCLK, an address latch output signal ADD_L, activated signals WL_A, WL_B, WL_C, and WL_D among word line selecting signals and activated signals CSL_A, CSL_B, CSL_C, and CSL_D among column selecting signals are shown in FIG. 6.

The data write and read operations of the semiconductor memory device of FIG. 4 are described below with reference to FIG. 6. The external clock signal CLK is toggled with a predetermined phase and cycle. Furthermore, the buffered clock signal PCLK is toggled with the same cycle as the external clock signal CLK by buffering the external clock signal CLK.

In the command signal CMD, a test mode start command TESTMODE, the active signal ACT, and data write and read commands of each memory bank are sequentially loaded at a rising edge of the external clock signal CLK. For convenience of description and understanding, this description assumes that a second memory bank data write and first memory bank read command WE_B & RE_A is loaded and the CAS latency is 2.

The test mode setting signal TMRS transitions from a low level to a high level according to the test mode start command TESTMODE. The input address signal ADD loads a mode setting signal having a predetermined code combination through address pins according to the test mode start command TESTMODE, loads the row address at a rising edge of the external clock signal CLK according to the active command ACT, and receives and latches the column address in advance at a falling edge of the external clock signal CLK. K second memory bank write data Di1_B-1 to Di1_B-K are applied at the rising and falling edges of the clock signal which are alternately shown according to the second memory bank data write and first memory bank data read command WE_B & RE_A.

The data I/O signal DQ loads L first memory bank read data Do_A-1 to Do_A-L through the data pins at the rising edge after 2 clocks from a first write data loading time point. At this time, the reason why a data collision does not occur in the semiconductor memory device even though the operation for receiving write data and the operation for outputting read data are simultaneously performed is because the second memory bank BA_B for writing data and the first memory bank BA_A for reading data are different.

That is, according to the data write and read commands of each memory bank, write data Di1_B-1 to Di1_B-K of the second memory bank BA_B are applied through the address pins at the rising edges and the falling edges which are alternately shown, and read data of other memory banks BA_A, BA_C, and BA_D excluding the second memory bank BA_B are delayed by a predetermined clock and then outputted through the data pins at the rising edges and the falling edges after a predetermined clock to which the CAS latency is applied. Thus, the read data Do_A-1 to Do_A-M of the first memory bank BA_A are outputted at the clock edge that the write data Di1_B-1 to Di1_B-K of the second memory bank BA_B are to be applied, and the read data of the second memory bank BA_B are outputted at the clock edge that the write data of the memory bank BA_C are to be applied. That is, because data write and read operations of different memory banks are performed in, for example, a pipe line method, the data collision does not occur in the semiconductor memory device even though the data write and read operations are simultaneously performed.

The address latch output signal ADD_L outputs the latched internal column address ca[14:0] at the next rising edge of the buffered clock signal PCLK, which pass through the column address decoder to be loaded to the column selecting signals CSL_A and CSL_B of the selected memory banks BA_A and BA_B.

The row address which is loaded to the input address signal ADD according to the active command ACT is synchronized with the buffered clock signal PCLK to be loaded to the word line selecting signals WL_A and WL_B of the selected memory banks BA_A and BA_B.

Figure 3:
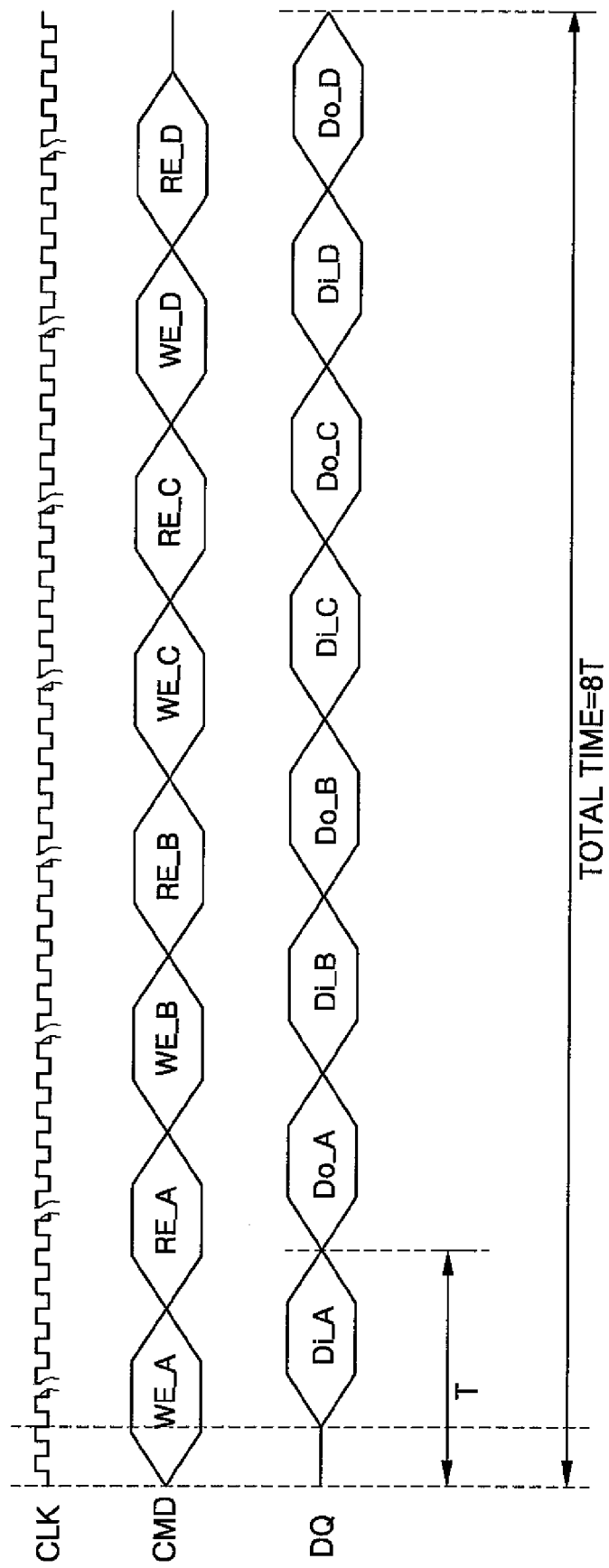
FIG. 3 is an operation timing diagram illustrating data write and read operation time of a plurality of memory banks in the conventional semiconductor memory device of FIG. 1.
Figure 7:
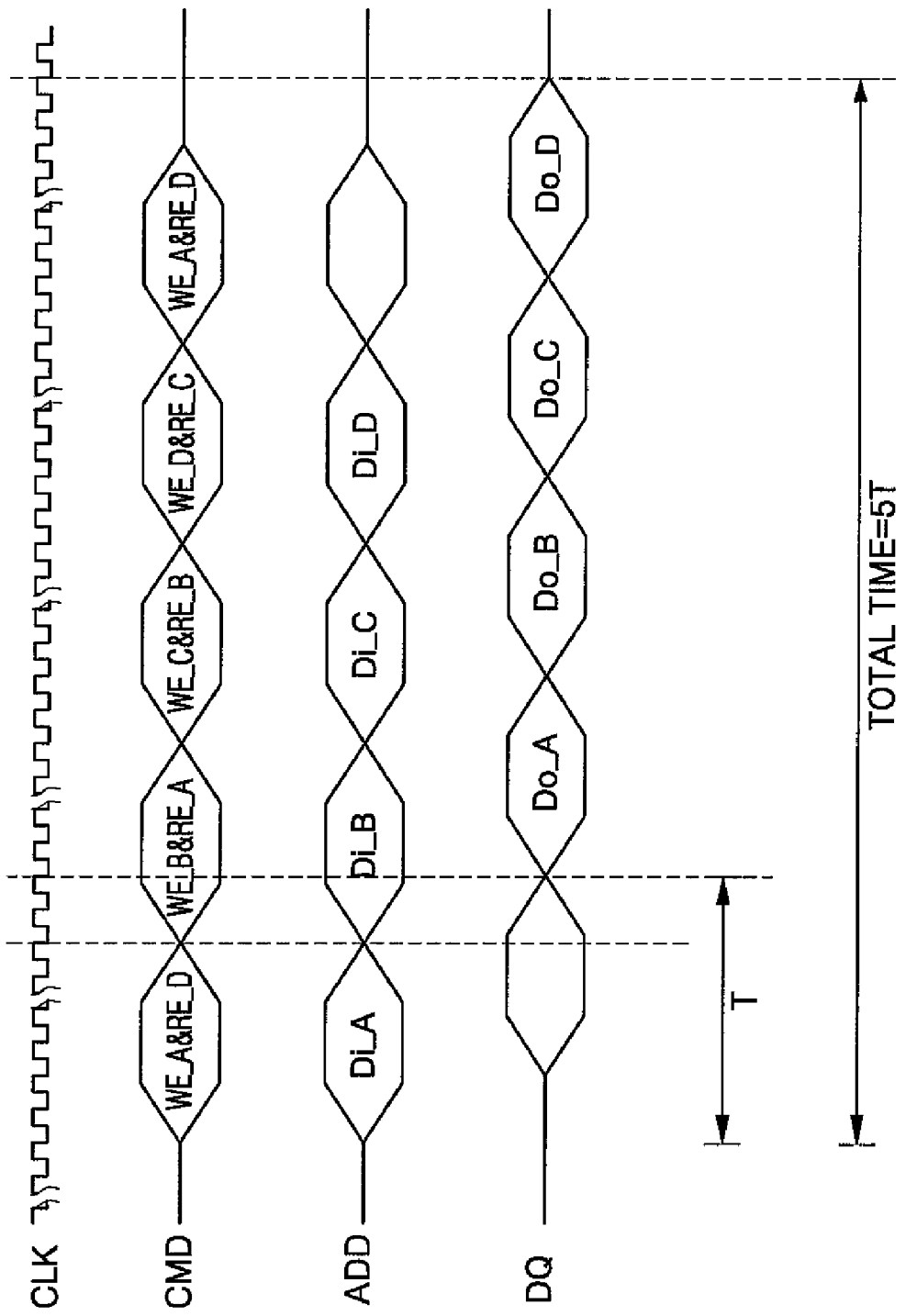
FIG. 7 is an operation timing diagram illustrating data write and read operation time of a plurality of memory banks in the semiconductor memory device of FIG. 4.

FIG. 7 is an operation timing diagram illustrating data write and read operation time of a plurality of memory banks in the semiconductor memory device of FIG. 4. The external clock signal CLK, the command signal CMD, the input address signal ADD, and the data I/O signal DQ are shown in FIG. 3.

The external clock signal CLK is toggled with a predetermined phase and cycle. In the command signal CMD, a first memory bank data write and fourth memory bank data read command WE_A & RE_D (hereinafter, first command), a second memory bank data write and first memory bank data read command WE_B & RE_A (hereinafter, second command), a third memory bank data write and second memory bank data read command WE_C & RE_B (hereinafter, third command), and a fourth memory bank data write and third memory bank data read command WE_D & RE_C (hereinafter, fourth command) are sequentially loaded.

The input address signal ADD sequentially loads a plurality of input data Di1_A in the first memory bank in response to the first command WE_A & RE_D, sequentially loads a plurality of input data Di1_B in the second memory bank in response to the second command WE_B & RE_A, sequentially loads a plurality of input data Di1_C in the third memory bank in response to the third command WE_C & RE_B, and sequentially loads a plurality of input data Di1_D in the fourth memory bank in response to the fourth command WE_D & RE_C.

The data I/O signal DQ sequentially loads the first to fourth output data Do_A, Do_B, Do_C, and Do_D of the first to fourth memory banks after a predetermined cycle to which the CAS latency is applied to the extent that they do not collide with the first to fourth input data Di1_A, Di1_B, Di1_C, and Di1_D, in a method of a pipe line structure, respectively, in response to the first to fourth commands WE_A & RE_D, WE_B & RE_A, WE_C & RE_B, and WE_D & RE_C. At this time, with respect to the first command WE_A & RE_D, because the input data written before the first command does not exist, the data I/O signal DQ goes into a high impedance state.

If a time spent to write/read data to/from one memory bank is defined as "T" in order to compare the operation timing diagram for the data write and read operation time of the semiconductor memory device of FIG. 4 to that of FIG. 1, a time 5T is spent to perform both the data write and read operations in the first to fourth memory banks.

Thus, a time 3T is reduced in the semiconductor memory device of FIG. 4 from the time 8T which is the data write and read operation time of a plurality of memory banks in the semiconductor memory device of FIG. 1. This reduction in data write and read operation time may be helpful in cases where the operation speed of the semiconductor memory device is high. This may also be helpful in reducing the test times of semiconductor memory devices and thus in reducing the manufacturing costs of semiconductor memory devices.

The data write and read operations of the exemplary disclosed semiconductor memory device are described in more detail below with reference to FIGS. 4 to 7. Specifically, the data write operation for writing data to the memory cell array 30 from a device external to the semiconductor memory device is first described.

Figure 2:
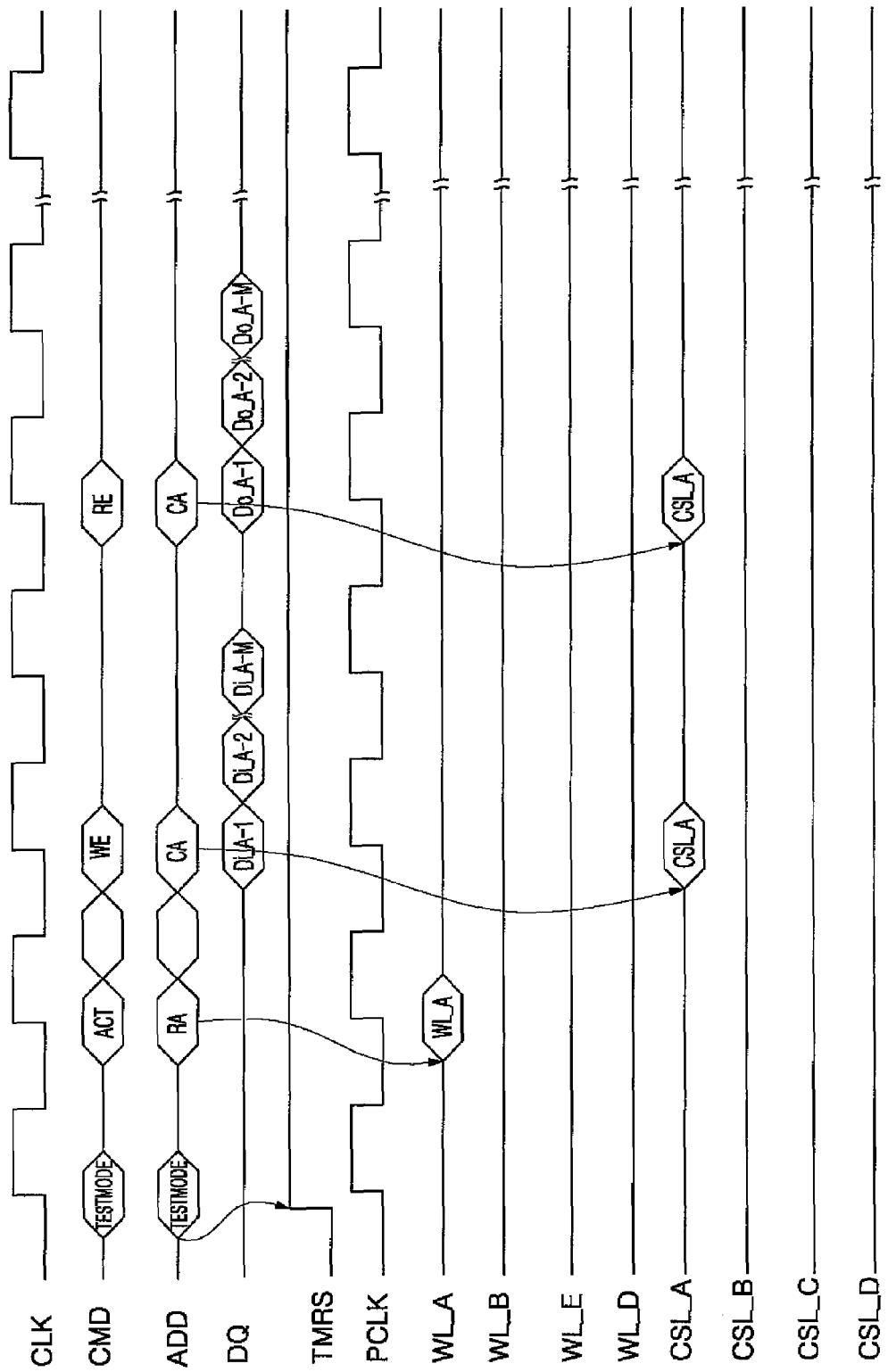
FIG. 2 is a timing diagram illustrating data write and read operations of the conventional semiconductor memory device of FIG. 1.

Operations for generating the active command ACT and the data write command WE in the command decoder 400, the internal row address ra[14:0] and the internal column address ca[14:0] in the column address decoder 500, and the test mode setting signal TMRS in the mode setting circuit 14, and activating one WL_A, WL_B, WL_C, and WL_D in each memory bank among a plurality of word selecting signals are same as in the data write operation of the conventional semiconductor memory device of FIGS. 1 to 3. Therefore, for purposes of brevity and clarity, a duplicated description is omitted.

In an exemplary disclosed embodiment, the address input buffer 300 not only generates the internal row address ra[14:0] and the internal column address ca[14:0] but also receives the write data from an external device and buffers and outputs the write data. Furthermore, the demultiplexer 110 receives the internal column address ca[14:0] from the address input buffer 300, receives the test mode setting signal TMRS from the mode setting circuit 14, and applies the output value to different blocks based on a level of the test mode setting signal TMRS.

In other words, in the normal operation mode in which the test mode setting signal TMRS value has a low level, the internal column address ca[14:0] is output directly to the column address decoder 500 and decoded, and then one of CSL_A, CSL_B, CSL_C, and CSL_D in each memory bank among a plurality of column selecting signals is activated. On the other hand, in the test operation mode in which the test mode setting signal TMRS value has a high level, the internal column address ca[14:0] is outputted to the column address latch 120 to be temporarily latched and then is outputted to the column address decoder 500 at the falling edge of the buffered clock signal PCLK to be decoded, and then one of CSL_A, CSL_B, CSL_C, and CSL_D in each memory bank among a plurality of column selecting signals is activated.

The write data selecting portion 200 i.e., the multiplexer receives the first write data Di1 applied through the address pin and the address input buffer 300, the second write data Di2 applied through the data pin, and the test mode setting signal TMRS from the mode setting circuit 14, and selectively outputs the write data according to the test mode setting signal TMRS value.

That is, the write data selecting portion 200 outputs the second write data Di2 applied through the data pin during the normal operation mode in which the test mode setting signal TMRS has a low level and outputs the first write data Di1 applied through the address pin and the address input buffer 300 during the test operation mode in which the test mode setting signal TMRS has a high level.

The data write circuit 24 receives first or second write data Di1 or Di2 which are serially inputted and converts them into parallel data, and then outputs them to the selected data write memory bank among the four memory banks BA_A, BA_B, BA_C, and BA_D in the memory cell array 30. The data write circuit 24 performs this operation in response to a combination of the bank address ra[14:3] which are the 2 most significant bits of the internal row address ra[14:0].

Next, the data read operation for reading data from the memory cell array 30 to a device external to the semiconductor memory device is described. Operations for generating the active command ACT and the data write command WE in the command decoder 400, the internal row address ra[14:0] and the internal column address ca[14:0] in the column address decoder 500, and the column selecting signals CSL_A, CSL_B, CSL_C, and CSL_D in the column address decoder 500 are same as in the data read operation of the conventional semiconductor memory device of FIGS. 1 to 3. Therefore, for purposes of brevity and clarity, a duplicated description is omitted.

Furthermore, an operation for applying the output value of the column address latch portion 100 through different paths in the normal mode and the test mode according to control of the test mode setting signal TMRS value to generate the column selecting signals CSL_A, CSL_B, CSL_C, and CSL_D is same as in the data write operation of the inventive semiconductor memory device of FIGS. 4 and 5 and thus, for purposes of brevity and clarity, a duplicated description is omitted.

As shown in FIG. 6, when the test mode start command TESTMODE is loaded to the command signal CMD and the mode setting signal having a predetermined code combination for starting the test mode is loaded to the input address signal ADD, the test mode setting signal TMRS transitions from a low level to a high level. In addition, the test operation mode starts when the test mode setting signal TMRS transitions from a low level to a high level.

The input address signal ADD loads the row address RA of total 15 bits at the rising edge of the external clock signal CLK when the active command ACT is loaded to the command signal CMD. Furthermore, the address input buffer 300 generates the internal row address ra[14:0], the row address decoder 20 decodes 13 least significant bits ra[12:0] to generate the word line selecting signals WL1 to WLn and decodes 2 most significant bits ra[14:13] as the bank address to select the memory bank in the memory cell array 30 to thereby activate one selecting signal WL_A, WL_B, WL_C, and WL_D in the corresponding memory bank.

At this time, since the second memory bank data write and first memory bank data read command WE_B & RE_A is loaded to the command signal CMD, the bank address "01" with which the "01" memory bank is matched during the data write operation and the "10" memory bank is matched during the data read operation as a combination of the most significant bits of the row address and the column address is applied to select the second memory bank BA_B and the first memory bank BA_A. Thus, one selecting signal WL_A and WL_B in the first and second memory banks which are activated to the first and second word line selecting signals are respectively loaded.

Moreover, the column address CA is applied and latched in advance to the input address signal ADD at the falling edge of the corresponding external clock signal CLK where the active command ACT is loaded to the command signal CMD. Additionally, the internal column address ca[14:0] is loaded to the address latch output signal ADDD_L at the rising edge of the next clock. Similar to when the word line is selected, because the second memory bank data write and first memory bank data read command WE_B & RE_A is loaded to the command signal CMD, selecting signals CSL_A and CSL_B in the first and second memory banks which are activated to the first and second column line selecting signals are respectively loaded at the rising edge of the same clock to which the column address CA is loaded.

The data read circuit 28 receives parallel data of predetermined bits from a selected data read memory bank among the fourth memory banks BA_A, BA_B, BA_C, and BA_D in the memory cell array 30 in response to a combination of the bank address ra[14:13] which are most significant bits of the internal row address ra[14:0]. Furthermore, the data read circuit 28 converts the received parallel data to serial data and outputs them to data pins.

For example, when the second memory bank data write and first memory bank data read command WE_B & RE_A is loaded to the command signal CMD, K second memory bank write data Di1_B-1 to Di1_B-K are sequentially loaded to the input address signal ADD at the rising edges and the falling edges of the external clock signal which are alternately shown, and L first memory bank read data Do_A-1 to Do_A-L are sequentially loaded to the data I/O signal DQ at the rising edges and the falling edges of the external clock signal after 2 clocks. In an exemplary embodiment, the first memory bank read data Do_A-1 to Do_A-L are sequentially loaded after 2 clocks because the CAS latency is 2.

Thus, the data write circuit 24 receives the first write data Di1_B-1 to Di1_B-K which are serially inputted, converts them into parallel data, and outputs them to the second memory bank BA_B which is the data write memory bank selected in response to "01" which is a combination of the bank address ra[14:13]. At the same time, the data read circuit receives parallel data of predetermined bits from the first memory bank BA_A which is the data read memory bank selected in response to "01" which is a combination of the bank address ra[14:13], converts them into serial data Do_A-1 to Do_A-L, and outputs them to the data pins.

Even though not shown in FIG. 6, with respect to the second to fourth commands WE_B & RE_A, WE_C & RE_B, and WE_D & RE_C of FIG. 7, the write data Di1_C, Di1_D and Di1_A of the third, fourth and first memory banks are sequentially loaded to the input address signal ADD, and after two clocks, the read data Do_B, Do_C and Do_D of the second, third and fourth memory banks are sequentially loaded to the data I/O signal DQ at the rising edge and the falling edge of the external clock.

Accordingly, the disclosed semiconductor memory device does not process both the write data and the read data through the data pin during the test mode operation. Instead, the disclosed semiconductor memory device uses the address pin during the data write operation and uses the data pin during the data read operation to simultaneously test the data write and read operations in parallel, thereby reducing the test time of the semiconductor memory device. As mentioned earlier, by reducing the testing time of a semiconductor memory device, among other things, the manufacturing cost of the memory device may be kept low.

What is claimed is:

1. A semiconductor memory device, comprising:
a memory cell array including a plurality of memory banks;
an address input portion which receives an external address through address pins and generates a row address and a column address during a normal mode operation and a test mode operation, and which receives a first write data through the address pins and outputs the first write data during a test mode operation;
an address decoder which accesses a selected memory bank of the plurality of memory banks during the normal mode operation and which accesses simultaneously at least one data write memory bank for a write operation and at least one data read memory bank for a read operation among the plurality of memory banks in response to the row address and the column address during the test mode operation;
a data input portion which inputs second write data applied through data pins to the selected memory bank during the normal mode operation and which inputs the first write data outputted from the address input portion to the data write memory bank during the test mode operation; and
a data output portion which outputs read data outputted from the selected memory bank to the data pins during the normal mode operation and which outputs read data from the data read memo bank to the data pins during the test mode operation.

2. The semiconductor memory device of claim 1, wherein the address input portion:
receives the row address in response to an active command and the column address in response to a read command or a write command, during the normal mode operation, and
receives the row address and the column address which are sequentially applied in response to the active command and output write data applied through the address pins in response to the write and read commands, during the test mode operation.

3. The semiconductor memory device of claim 1, wherein the address decoder:
accesses one of the plurality of memory banks in response to predetermined bits among the row address and the column address during the normal mode operation wherein a combination of the predetermined bits designates the plurality of memory banks respectively, and
accesses at least two of the plurality of memory banks in response to the predetermined bits during the test mode operation wherein a combination of the predetermined bits differently designates a data write memory bank and a data read memory bank.

4. The semiconductor memory device of claim 3, wherein the predetermined bits are most significant bits of any of the row address and the column address and are used as a bank address.

5. The semiconductor memory device of claim 1, further comprising,
a command decoder which receives and decodes external commands to generate an active signal, a write signal, and a read signal during the normal mode operation and to generate the active signal and the write and read signal during the test mode operation;
a column address latch portion which receives the column address, and outputs the column address to the address decoder during the normal mode operation and outputs the column address to the address decoder at a predetermined time point after latching the column address during the test mode operation; and
a clock buffer which receives and buffers an external clock signal to generate a buffered clock signal.

6. The semiconductor memory device of claim 5, wherein the column address latch portion comprises:
a column address latch which receives the column address, temporarily latches the column address, synchronizes the column address with the buffered clock signal, and outputs the synchronized buffered clock signal to the address decoder, during the test mode operation; and
a demultiplexer which receives the column address, outputs the column address directly to the address decoder during the normal mode operation and outputs the column address to the column address latch during the test mode operation.

7. The semiconductor memory device of claim 5, wherein the address input portion:
loads the row address and latches the column address in response to the external clock signal according to the active command, and
receives write data of each of the plurality of memory banks in response to the external clock signal according to the plurality of data write and read commands.

8. The semiconductor memory device of claim 5, wherein the data input portion comprises:
a write data selecting portion including a multiplexer which receives write data applied through the address pins and write data applied through the data pins to output the write data applied through the data pins during the normal mode operation and to output the write data applied through the address pins during the test mode operation; and
a data write circuit which receives serially input write data applied through the data pins or the address pins, converts the serially input write data into parallel data, and outputs the parallel data to the data write memory bank in response to the bank address.

9. The semiconductor memory device of claim 5, wherein the data output portion comprises a data read circuit which receives parallel data of predetermined bits from a data read memory bank in response to a bank address, converts the parallel data into serial data, and outputs the serial data to the data pins.

10. A data write and read method of a semiconductor memory device comprising a memory cell array including a plurality of memory banks and an address decoder which accesses at least one of the plurality of memory banks in response to a row address and a column address, the method comprising:
inputting an address by receiving an external address applied through address pins and generating the row address and the column address during a normal mode operation and a test mode operation, and receiving a first write data through the address pins and outputting the first write data during the test mode operation;
accessing a memory bank by accessing a selected memory bank of the plurality of memory banks during the normal mode operation and by accessing simultaneously at least one data write memory bank for a write operation and at least one data read memory bank for a read operation among the plurality of memory banks in response to the row address and the column address during the test mode operation; and
inputting/outputting data by inputting second write data applied through data pins to the selected memory bank and outputting read data outputted from the selected memory bank to the data pins during the normal mode operation, and inputting the second write data to the data write memory bank and outputting read data output from the data read memory bank to the data pins during the test mode operation.

11. The data write and read method of claim 10, wherein the inputting an address comprises:

receiving the row address in response to an active command and the column address in response to a read command or a write command, during the normal mode operation, and receiving the row address and the column address which are sequentially applied in response to the active command and outputting write data applied through the address pins in response to the write and read commands, during the test mode operation.

12. The data write and read method of claim 10, wherein accessing the memory bank comprises:

accessing one of the plurality of memory banks in response to predetermined bits among the row address and the column address during the normal mode operation wherein a combination of the predetermined bits designates the plurality of memory banks respectively, and accessing at least two of the plurality of memory banks in response to the predetermined bits during the test mode operation wherein a combination of the predetermined bits differently designates a data write memory bank and a data read memory bank.

13. The data write and read method of claim 12, wherein the predetermined bits are most significant bits of any of the row address and the column address and are used as a bank address.

14. The data write and read method of claim 10, further comprising:

latching an address by receiving the column address, outputting the column address to the address decoder during the normal mode operation and outputting the column address to the address decoder at a predetermined time point after latching the column address during the test mode operation; and generating a buffered clock signal by receiving and buffering an external clock signal.

15. The data write and read method of claim 14, wherein the latching an address comprises:

latching a column address by receiving the column address, temporarily latching the column address, synchronizing the column address with the buffered clock signal, and outputting the synchronized buffered clock signal to the address decoder, during the test mode operation; and demultiplexing a column address by receiving the column address, outputting the column address directly to the address decoder during the normal mode operation and starting the column address latching during the test mode operation.

16. The data write and read method of claim 14, wherein the inputting an address comprises:

loading the row address and latching the column address in response to the external clock signal according to an active command, and receiving write data of each of the plurality of memory banks in response to the external clock signal according to a plurality of data write and read commands.

17. The data write and read method of claim 14, wherein the inputting/outputting data comprises:

selecting write data by receiving write data applied through the address pins and write data applied through the data pins to output the write data applied through the data pins during the normal mode operation and to output the write data applied through the address pins during the test mode operation;

writing data by receiving a serially input write data applied through the data pins or the address pins, converting the serially inputted write data into parallel data, and outputting the parallel data to a data write memory bank in response to the bank address; and reading data by receiving parallel data of predetermined bits from a data read memory bank in response to the bank address, converting the parallel data into serial data, and outputting the serial data to the data pins.

* * * * *